United States Patent
Zhao

(10) Patent No.: US 10,797,110 B2
(45) Date of Patent: Oct. 6, 2020

(54) ORGANIC PHOTODIODE PIXEL FOR IMAGE DETECTORS

(71) Applicant: General Electric Company, Schenectady, NY (US)

(72) Inventor: Ri-an Zhao, Niskayuna, NY (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 0 days.

(21) Appl. No.: 15/645,370

(22) Filed: Jul. 10, 2017

(65) Prior Publication Data

US 2019/0013360 A1    Jan. 10, 2019

(51) Int. Cl.
| | | |
|---|---|---|
| *H01L 29/08* | (2006.01) | |
| *H01L 27/30* | (2006.01) | |
| *H01L 51/00* | (2006.01) | |
| *H01L 51/44* | (2006.01) | |
| *H01L 27/12* | (2006.01) | |
| *H01L 51/42* | (2006.01) | |

(52) U.S. Cl.
CPC ........ *H01L 27/307* (2013.01); *H01L 51/0003* (2013.01); *H01L 51/0012* (2013.01); *H01L 27/1214* (2013.01); *H01L 51/4253* (2013.01); *H01L 51/441* (2013.01)

(58) Field of Classification Search
USPC .......................................................... 257/40
See application file for complete search history.

(56) References Cited

U.S. PATENT DOCUMENTS

| | | | | |
|---|---|---|---|---|
| 6,300,612 B1 * | 10/2001 | Yu | .......................... | B82Y 10/00 |
| | | | | 250/208.1 |
| 6,483,099 B1 * | 11/2002 | Yu | .......................... | B82Y 10/00 |
| | | | | 250/214.1 |
| 8,441,001 B2 | 5/2013 | Fuerst et al. | | |
| 9,257,480 B2 | 2/2016 | Zhao et al. | | |
| 9,285,489 B2 | 3/2016 | Couture et al. | | |
| 10,509,135 B2 * | 12/2019 | Nelson | .................. | G01T 1/2018 |

(Continued)

OTHER PUBLICATIONS

Taghibakhsh, Farhad, et al.; "X-Ray Detection Using a Two-Transistor Active Pixel Sensor Array Coupled to an a-Se X-Ray Photoconductor", IEEE Sensors Journal, vol. 9, Issue 1, pp. 51-56, Jan. 2009.

(Continued)

*Primary Examiner* — Caleb E Henry
(74) *Attorney, Agent, or Firm* — Fletcher Yoder, P.C.

(57) ABSTRACT

Imaging panels and imaging systems that may employ use organic photodiodes or other continuous sensors are discussed. The detector panels discussed may have a non-pixelated organic photodiode disposed above a pixelated backplane. In some embodiments, the sensor panels may also include dielectric structures that create buried vias in the region of contact between the organic photodiode and the thin film transistor (TFT) backplane. In some embodiments, the sensor panels may include dielectric structures that separate neighboring pixels. The dielectric structures may decrease thickness inhomogeneity in active areas of the organic photodiode. Detector panels discussed herein may have decreased sensing lag and current leakage, and improved reliability. Methods for formation of organic photodiodes and of dielectric structures are also discussed.

17 Claims, 5 Drawing Sheets

(56) References Cited

U.S. PATENT DOCUMENTS

| | | | |
|---|---|---|---|
| 2008/0067324 A1* | 3/2008 | Heiler | H01L 27/14658 |
| | | | 250/208.1 |
| 2008/0121442 A1* | 5/2008 | Boer | G06F 3/0412 |
| | | | 178/18.09 |
| 2008/0302969 A1 | 12/2008 | Jung et al. | |
| 2012/0121067 A1 | 5/2012 | Hayden et al. | |
| 2014/0241391 A1* | 8/2014 | Abe | H01S 5/1053 |
| | | | 372/45.012 |
| 2014/0295626 A1* | 10/2014 | Park | C23F 1/18 |
| | | | 438/151 |
| 2015/0144889 A1 | 5/2015 | An et al. | |
| 2016/0027847 A1 | 1/2016 | Liu | |
| 2016/0111473 A1 | 4/2016 | Liu et al. | |
| 2018/0341031 A1* | 11/2018 | Tredwell | H04N 5/32 |

OTHER PUBLICATIONS

Iacchetti, Antonio, et al.; "Multi-Layer Organic Squaraine-Based Photodiode for Indirect X-Ray Detection", IEEE Transactions on Nuclear Science, vol. 59, Issue 5, pp. 1862-1867, Oct. 2012.

Kim, Hyunsoo, et al.; "Top Illuminated Organic Photodetectors with Dielectric/Metal/Dielectric Transparent Anode", Organic Electronics, vol. 20, pp. 103-111, 2015.

\* cited by examiner

ORGANIC PHOTODIODE PIXEL FOR IMAGE DETECTORS

TECHNICAL AREA

The subject matter disclosed herein relates to photon sensors and imaging detector panels. Specifically, the disclosure discusses imaging sensing panels that employ organic photodiode (OPD).

BACKGROUND

Devices such as digital photography and/or videography, medical imaging systems, and other image sensing equipment may employ panels that are capable of capturing photons and generating signals corresponding to a sensing array that correspond to an image or a projection of that object. For example, medical X-ray imaging systems may operate by placing a patient between an X-ray emitter and an X-ray sensor. In this example, the emitted X-ray travels through different tissues of the patient and is collected in a pixel array of the X-ray sensor. As different tissues may absorb a different proportion of the X-ray photons, an X-ray map of the patient may be produced from the data collected in the pixel array.

In some implementations, the X-rays may be directly detected by the panel, while in other implementations, some intermediate structure, such as a scintillator, may be used to convert X-ray into visible light or other lower energy photons that are detected. The conversion of light in such an example into an electrical signal may be performed by a photodiode. Examples of photodiodes include organic photodiodes. Organic photodiodes are detectors that may be formed from organic small molecules and/or polymers. Organic photodiodes may be coupled to pixel-based sensors, such as a thin-film transistors (TFT) arranged in an array that may be used to provide spatial information about the location of the photon that arrived. Organic photodiodes may provide mechanical flexibility, higher sensor density, and/or high thermal stability. However, implementation of sensor panels employing organic photodiodes may include certain manufacturing and design challenges that may lead to noisy images.

BRIEF DESCRIPTION

Embodiments described herein are related to imaging sensors and systems that may employ a continuous detector plane and may be configured to couple to a pixelated thin-film transistor (TFT) backplane. The embodiments may include dielectric structures that may improve certain operational characteristics such as image quality, panel reliability and/or data acquisition rate.

In one embodiment, an imaging system is discussed. The imaging system may have a radiation source and a detector panel that may receive emissions produced by the radiation source and transmitted through a subject. The detector panel may have a detector backplane that is pixelated, and a sensing photodiode layer that may include an anode layer having multiple anodes. Each anode of the anode layer may be coupled to a corresponding pixel of the backplane, and each anode is separated from the neighboring anodes by a boundary region. The photodiode layer may also include a photoactive layer that includes a photoactive material, and is placed above the anode layer. The photodiode layer may also have a first plurality of dielectric structures located along the boundaries separating the pixels, and a second plurality of dielectric structures disposed above the electrical coupling region between each anode of the anode layer and the detector backplane. The photodiode layer may also include a cathode layer placed above the photoactive layer.

In another embodiment, an organic photodiode panel is described. The organic photodiode panel may include a first electrode layer and a second electrode layer. The first electrode layer may have pixels, and each pixel has a recessed region. The organic photodiode panel may also have a photoactive layer placed between the first electrode layer and the second electrode layer. The organic photodiode panel may also have a dielectric structure placed in the recessed region of the pixel below the photoactive layer and a second dielectric structured placed along a boundary of the pixel.

A method for manufacturing of a sensor panel is also described. The method may include processes for forming an electrode layer above a backplane layer, placing a dielectric layer above the first electrode layer, and performing a photolithography process to pattern the dielectric layer. The method may also include processes for coating the dielectric layer with a photodiode layer, and forming a second electrode layer above the photodiode layer.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
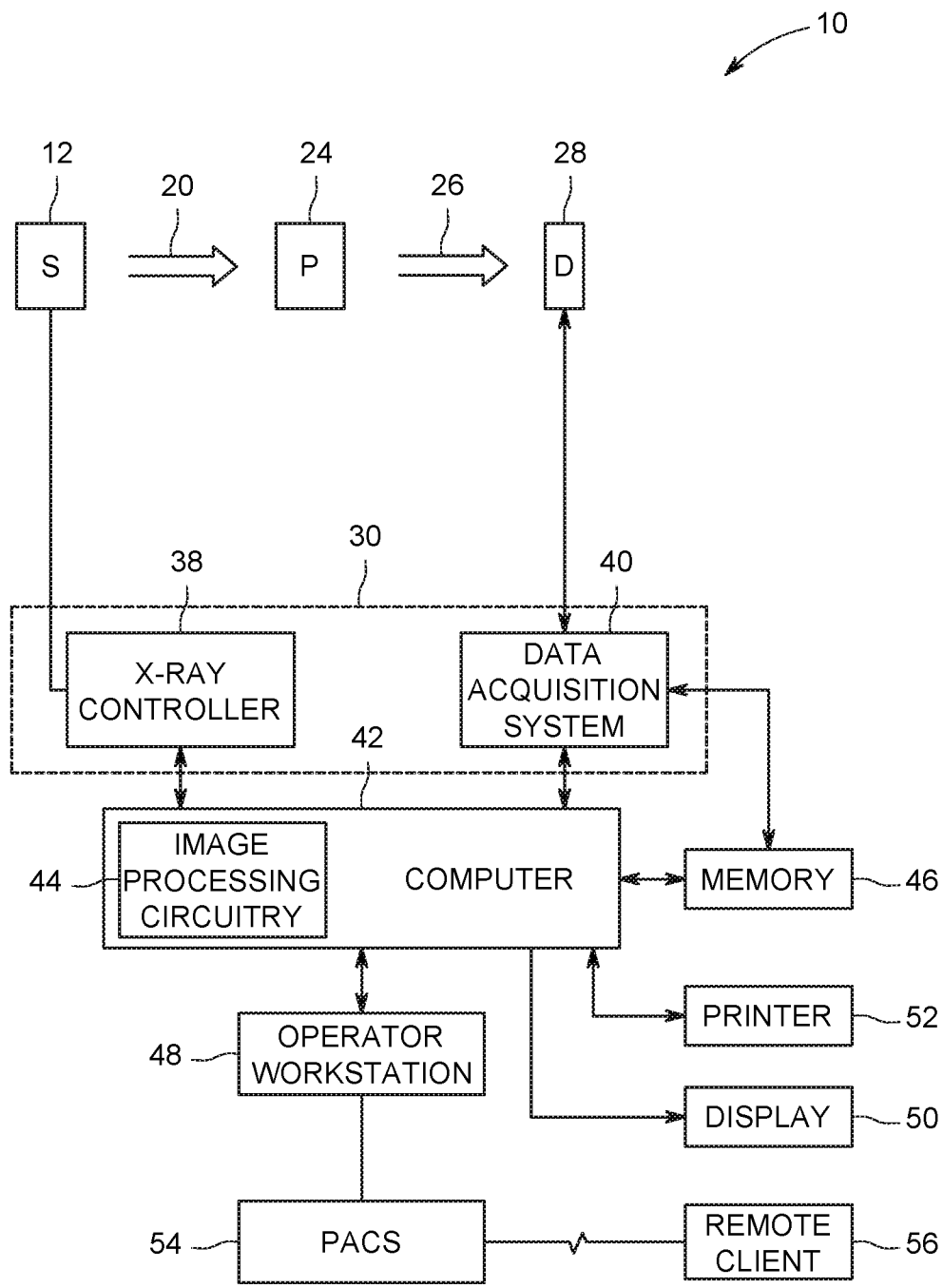
FIG. 1 is a block diagram of medical imaging system that may employ one or more image detectors, in accordance with an embodiment.

One or more specific embodiments will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present invention, the articles "a," "an," "the," and "said" are intended to mean that there are one or more of the elements. The terms "comprising," "including," and "having" are intended to be inclusive and mean that there may be additional elements other than the listed elements. Furthermore, any numerical examples in the following discussion are intended to be non-limiting, and thus additional numerical values, ranges, and percentages are within the scope of the disclosed embodiments.

While aspects of the following discussion may be provided in the context of medical imaging, it should be appreciated that the present techniques are not limited to such medical contexts, nor to X-ray technology. Indeed, the provision of examples and explanations in such a medical context is only to facilitate explanation by providing instances of real-world implementations and applications. However, the present approaches may also be utilized in other contexts, such as imaging methods for non-destructive inspection of manufactured parts or goods (i.e., quality control or quality review applications), and/or non-invasive inspection of packages, boxes, luggage, and so forth (i.e., security or screening applications). In general, the present approaches may be useful in any imaging or screening context or image processing field where image data is acquired using imaging sensing panels.

Imaging systems, such as digital radiography systems, tomosynthesis equipment, mammography systems, computed tomography systems, nuclear imaging (PET, SPECT, etc.) employ radiation detectors for data acquisition. In some implementations, the imaging sensing panels may be coupled to some detecting device (e.g., scintillators) that may convert incident radiation into lower energy photons (such as in in the optical or light energy wavelength band and adjacent ranges) to be detected by a light detector panel. These light detector panels may include one or more light detectors, such as photodiodes, that may be coupled to backplane circuitry. Embodiments described herein are related to certain light detector panels that may be formed by layering fabrication methods. As an example, a light detector panel may be formed using continuous (i.e., non-pixelated) organic photodiodes (OPD) that may be coupled to a thin film transistor (TFT) array backplane. In such a light detector panel, when a photon interacts with the OPD layer, it generates a charge that may be extracted (e.g., collected) through electrodes of the OPD, and measured and/or quantified in the TFT backplane. Light detectors panels produced using layering fabrication methods may be formed by depositing wet layers above the backplane. During the assembly of certain light detector panels, the wet layers may reflow as they dry, due to solvent evaporation, and generate non-uniform regions. In the example of a light detector panel formed from OPDs placed above a backplane, the OPD layer may be formed by deposition of a wet photoactive layer placed between two electrodes. Since the backplane surface is not smooth (e.g., flat) and may have spatially and/or elevationally distinct features or structures, the reflow process may lead to substantial variations in the thickness of the OPD, as detailed below.

Moreover, several of the digital systems may collect pixelated data. In such systems, the backplane circuitry may include an array of distinct circuitry elements (e.g., pixel elements, pixel circuitry, pixels), wherein each element determines the spatial location of the pixels. As detailed below, the pixel circuitry in the backplane may be coupled to a pixelated light detector panel. Furthermore, certain light detector panels may be continuous (e.g., not pixelated), and the pixel boundaries may be determined by the backplane circuitry. Note that, due to the construction and arrangement of the layers, the boundaries between neighboring pixels may have some overlap and/or may have fringe regions, where charge extraction from the light detector panel to the backplane may be slower. This results in an increase in image lag, which may slow down the overall image acquisition process. Embodiments described herein provide dielectric structures that may be placed in specific areas of the photodiode to reduce the effects of variable thickness regions and fringe areas in the image acquisition process. In some embodiments, the dielectric structures may be placed during manufacturing, by use of photolithography, as detailed below.

With the preceding discussion in mind, FIG. 1 illustrates an embodiment of an imaging system 10 for acquiring and processing image data using imaging sensing panels in accordance with structures and approaches discussed herein. In the illustrated embodiment, system 10 is a medical imaging system such as a digital X-ray system designed to acquire X-ray data and to produce an image that corresponds to an X-ray map of a patient. The imaging system 10 includes one or more X-ray sources 12, such as one or more X-ray tubes or solid-state emission structures which allow X-ray generation at one or more energy spectra during an imaging session.

The X-ray beam 20 passes into a region in which the subject (e.g., a patient 24) or object of interest (e.g., manufactured component, baggage, package, and so forth) is positioned. The subject attenuates at least a portion of the X-ray photons 20, resulting in attenuated X-ray photons 26 that impinge upon a detector 28. Detector 28 may be formed by a plurality of sensing elements (e.g., pixels) arranged in backplane and coupled to a light detector panel, which may be, for example an OPD layer. Detector 28 may also include a scintillator or some other structure that may convert the attenuated the X-ray photons 26 into photons that may be detected by the light detector panel. By way of example, the detector 28 may have scintillators that produces photons in the visible or adjacent spectra in response to X-ray excitation, a non-pixelated light detecting panel that generates a charge for every photon interaction in the region of the panel where the photon was produced by a scintillator and, whose output signal may be read by a pixelated backplane detector layer that captures the charge in the light detecting panel. Note that use of certain materials, such as photoactive organic compounds used in OPD, allows assembly of detector 28 with curved surfaces. These curved surfaces may be shaped according to an ergonomic aspect of a patient 24, which may increase comfort during operation. Curved surfaces may also allow the sensor to be closer to a region of interest of patient 24, which may increase image quality (e.g., resolution, signal to noise ratio, etc.).

The electrical signals may be acquired and processed to generate one or more image datasets. In the depicted example, the detector 28 is coupled to the system controller 30, which commands acquisition of the digital signals generated by the detector 28. System controller 30 commands operations of the imaging system 10 to execute examination and/or calibration protocols, and may process the acquired data. With respect to the X-ray source 12, the system controller 30 furnishes power, focal spot location, control signals and so forth, for the X-ray examination sequences. In addition, the system controller 30 may include signal processing circuitry and associated memory circuitry. In such embodiments, the memory circuitry may store programs, routines, and/or encoded algorithms executed by the system controller 30 to operate the imaging system 10, including the X-ray source 12, and to process the digital measurements acquired by the detector 28 in accordance with the steps and processes discussed herein.

The system controller 30 may include a data acquisition system (DAS) 40. The DAS 40 receives data collected by readout electronics of the detector 28, such as digital signals from the detector 28. The DAS 40 may then convert and/or process the data for subsequent processing by a processor-based system, such as a computer 42. In certain implementations discussed herein, circuitry within the detector 28 may convert analog signals of the detector to digital signals prior to transmission to the data acquisition system 40. The computer 42 may include or communicate with one or more non-transitory memory devices 46 that can store data processed by the computer 42, data to be processed by the computer 42, or instructions to be executed by image processing circuitry 44 of the computer 42. For example, a processor of the computer 42 may execute one or more sets of instructions stored on the memory 46, which may be a memory of the computer 42, a memory of the processor, firmware, or a similar instantiation. By way of example, the image processing circuitry 44 of the computer 42 may be configured to generate a diagnostic image.

The computer 42 may also be adapted to control features enabled by the system controller 30 (i.e., scanning operations and data acquisition), such as in response to commands and scanning parameters provided by an operator via an operator workstation 48. The system 10 may also include a display 50 coupled to the operator workstation 48 that allows the operator to view relevant system data, imaging parameters, raw imaging data, reconstructed data (e.g., soft tissue images, bone images, segmented vascular trees, and so on), material basis images, and/or material decomposition results, and so forth. Additionally, the system 10 may include a printer 52 coupled to the operator workstation 48 and configured to print any desired measurement results. The display 50 and the printer 52 may also be connected to the computer 42 directly (as shown in FIG. 1) or via the operator workstation 48. Further, the operator workstation 48 may include or be coupled to a picture archiving and communications system (PACS) 54. PACS 54 may be coupled to a remote system or client 56, radiology department information system (RIS), hospital information system (HIS) or to an internal or external network, so that others at different locations can gain access to the image data.

Figure 2:
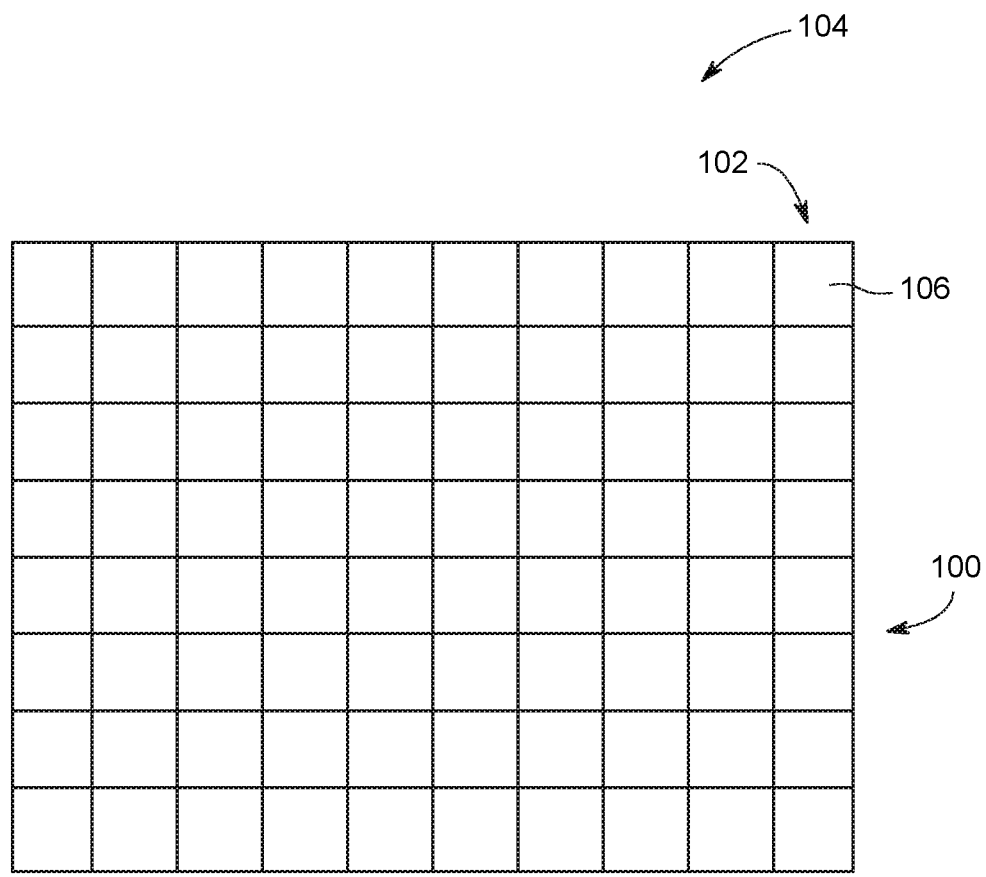
FIG. 2 is a schematic diagram of a pixel array of an image detector, in accordance with an embodiment.

As discussed above, detector 28 may be include a light sensing layer formed above a pixelated backplane array. FIG. 2 illustrates an example of a backplane sensing array 100 having evenly-spaced detector pixels 106. Detector panel 28 may have columns 102 and rows 104 of pixels 106. As discussed above, the detector may have a continuous (e.g., non-pixelated) OPD light sensing layer disposed above a pixelated backplane layer and, as such, the boundaries of the pixels 106 may be determined by the backplane layer pixelation. In certain embodiments, the boundaries of pixels 106 may be further determined by the boundaries of the electrodes (e.g., anode and/or cathode) of the OPD light sensing layer. Note that, while the illustrated example in FIG. 2 is a flat and uniform (e.g., evenly-spaced) detector panel 28, the systems and methods described here may be used for curved detector panels and/or unevenly spaced pixelated panels with the appropriate adjustments of manufacturing process and/or backplane terminations. The separation between neighboring pixels (i.e., the pitch) may be between 50 µm and 200 µm.

Figure 3:
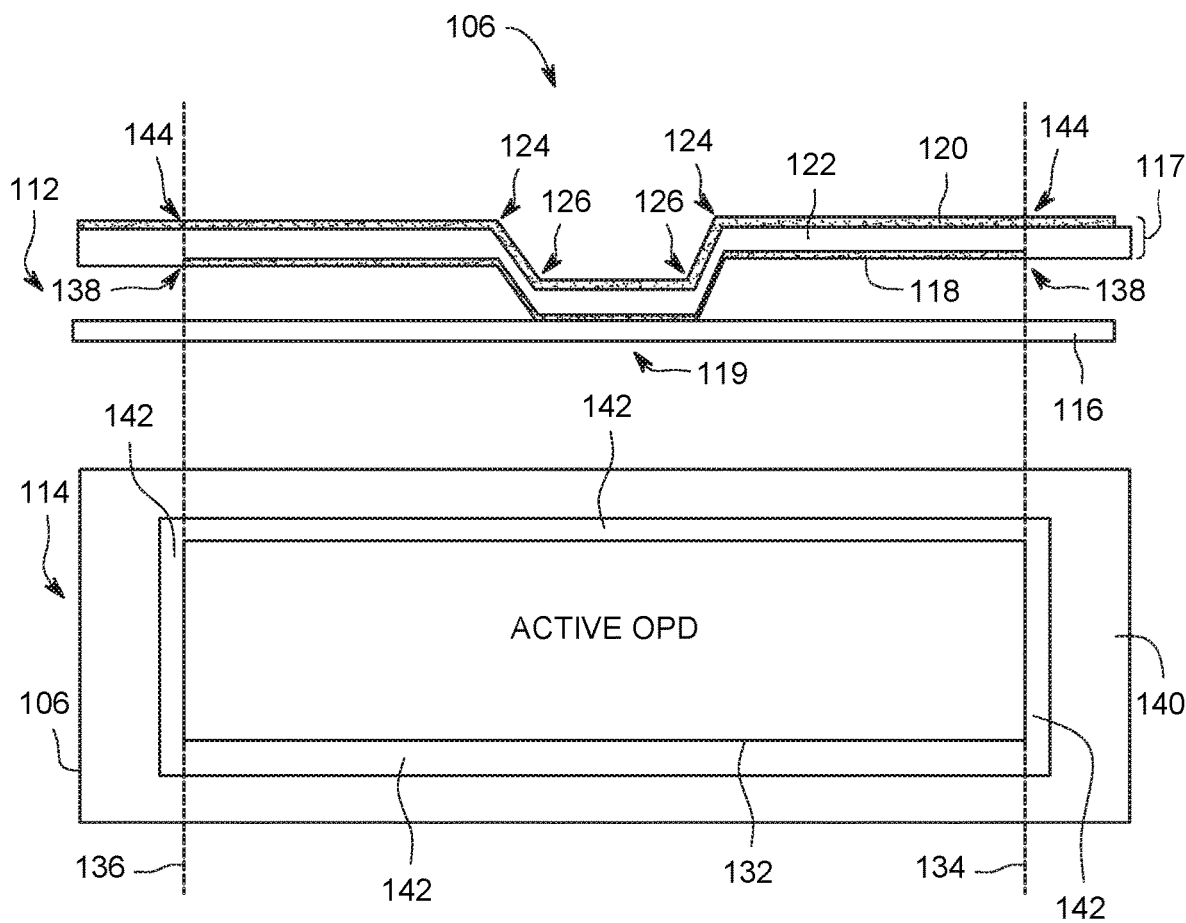
FIG. 3 is a schematic front view and side view of a pixel of an image detector with an organic photodiode, in accordance with an embodiment.

FIG. 3 provides a schematic front view 112 and side view 114 of a pixel 106 (e.g., pixel circuitry). Pixel 106 may be formed by a TFT backplane 116 that may sense photons interacting within an active area of photodiode 117. Photodiode 117 may be formed by an anode layer 118, a cathode layer 120, and a photoactive layer 122. Anode layer 118 and cathode layer 120 may be coupled to pixel circuitry of the TFT backplane 116. As a photon interacts with the photoactive layer 122, a free charge may be generated and collected by anode 118 and cathode 120. The TFT backplane 116 may measure the interaction using the coupling between anode 118 and TFT backplane 116 through contact region 119. In certain embodiments, the TFT backplane 116 may have a transistor terminal, such as a TFT source or drain in region 119, which may act as a driver for quantification (e.g., photon counting, energy integrating) circuitry.

Photodiode 117 may be an OPD and the material that forms the photoactive layer may be, for example, a coated solution containing organic materials that generate a charge when interacting with photons. The OPD may be formed with a bulk, hetero-junction organic photodiode layer that absorbs light, generates electron-hole pairs, and transports charge (e.g., holes and electrons) to the electrode layers 118 and 120. The organic absorber layer may include a blend of a donor material and an acceptor material; more than one donor or acceptor material may be included in the blend. Suitable donor materials include low bandgap polymers and may include conjugated polymers and copolymers composed of units derived from substituted or unsubstituted monoheterocyclic and polyheterocyclic monomers such as thiophene, fluorene, phenylenvinylene, carbazole, pyrrolopyrrole, and fused heteropolycyclic monomers containing the thiophene ring, including, but not limited to, thienothiophene, benzodithiophene, benzothiadiazole, pyrrolothiophene monomers, and substituted analogs thereof. In some embodiments, the low band gap polymers include units derived from substituted or unsubstituted thienothiophene, benzodithiophene, benzothiadiazole, carbazole, isothianaphthene, pyrrole, benzo-bis(thiadiazole), thienopyrazine, fluorene, thiadiazolequinoxaline, or combinations thereof. In the context of the low band gap polymers described herein, the term "units derived from" means that the units include monoheterocyclic and polyheterocyclic group, without regard to the substituents present before or during the polymerization; for example, "the low band gap polymers include units derived from thienothiophene" means that the low band gap polymers include divalent thienothiophenyl groups. Examples of suitable materials for use as low bandgap polymers in the organic photodetectors, in some embodiments, include copolymers derived from substituted or unsubstituted thienothiophene, benzodithiophene, benzothiadiazole, carbazole monomers, or combinations thereof, such as poly[[4,8-bis[(2-ethylhexyl)oxy]benzo[1,2-b:4,5-bl-dithiophene-2,6-diyl][3-fluoro-2-[(2-ethylhexyl) carbonyl] thieno[3,4-b]thiophenediyl] (PTB7); 2,1,3-benzothiadiazole-4,7-diyl[4,4-bis(2-ethylhexyl)-4H-cyclopenta[2,1-b:3,4-b]] dithiophene-2,6-diyl (PCPDTBT); poly[[9-(1-octylnonyl)-9H-carbazole-2,7-diyl]-2,5-thiophenediyl-2,1,3-benzothiadiazole-4,7-diyl-2,5-thiophenediyl](PCDTBT); poly[(4,40-bis(2-ethylhexyl)dithieno [3,2-b:20,30-d]silole)-2,6-diyl-alt-(2,1,3-benzo-thiadiazole)-4,7-diyl](PSBTBT); poly((4,8-bis (octyloxy)benzo(1,2-b:4,5-b)dithiophene-2,6-diyl)(2 ((dodecyloxy)carbonyl) thieno(3,4-b)thiophenediyl)) (PTB1); poly((4,8-bis(octyloxy)benzo(1,2-b:4, 5-b)dithiophene-2,6-diyl)(2 ((ethylhexyloxy)carbonyl) thieno(3,4-b)thiophenediyl)) (PTB2); poly((4,8-bis(octyl) benzo(1,2-b:4,5-b)dithiophene-2,6-diyl) (2 ((ethylhexyloxy)

carbonyl) thieno(3,4-b)thiophenediyl)) (PTB3); poly((4,8-bis-(ethylhexyloxybenzo(1,2-b:4,5-b)dithiophene-2,6-diyl)(2 ((octyloxy)carbonyl)-3-fluoro)thieno(3,4-b)thiophenediyl)) (PTB4); poly((4,8-bis(ethylhexyloxybenzo (1,2-b:4,5-b)dithiophene-2,6-diyl)(2 ((octyloxy)carbonyl) thieno(3,4-b)thiophenediyl)) (PTB5); poly((4,8-bis(octyloxy) benzo(1,2-b:4,5-b)dithiophene-2,6-diyl)(2 ((butyloctyloxy)carbonyl) thieno(3,4-b)thiophenediyl)) (PTB6); poly[[5-(2-ethylhexyl)-5,6-dihydro-4,6-dioxo-4H-thieno[3,4-c] pyrrole-1,3-diyl][4,8-bis[(2-ethylhexyl)oxy]benzo[1,2-b:4, 5-bldithiophene-2,6-diyl]](PBDTTPD); poly[1-(6-{4,8-bis [(2-ethylhexyl)oxy]-6-methylbenzo[1,2-b:4,5-b'] dithiophen-2-yl}-3-fluoro-4-methylthieno[3,4-b]thiophen-2-yl)-1-octanone](PBDTTT-CF); or poly[2,1,3-benzothiadiazole-4,7-diyl-2,5-thiophenediyl(9,9-dioctyl-9H-9-silafluorene-2,7-diyl)-2,5-thiophenediyl](PSiF-DBT). Other suitable materials include poly[5,7-bis(4-decanyl-2-thienyl) thieno[3,4-b]diathiazole-thiophene-2,5](PDDTT); poly[2,3-bis(4-(2-ethylhexyloxy)phenyl)-5,7-di(thiophen-2-yl)thieno[3,4-b]pyrazine](PDTTP); or polythieno[3,4-b] thiophene (PTT). In certain embodiments, suitable materials are copolymers derived from substituted or unsubstituted benzodithiophene monomers, such as the PTB1-7 series and PCPDTBT; or benzothiadiazole monomers, such as PCDTBT and PCPDTBT. Suitable acceptor materials include fullerenes and their derivatives such as [6,6]-phenyl-C61-butyric acid methyl ester (PCBM); PCBM analogs such as PC70BM, PC71BM, PC80BM, bis-adducts thereof, such as bis-PC71BM, indene mono-adducts thereof, such as indene-C60 monoadduct (ICMA) or indene bis-adducts thereof, such as indene-C60 bisadduct (ICBA). Other materials such as poly[(9,9-dioctylfluorenyl-2,7-diyl)-alt-(4,7-bis(3-hexylthiophen-5-yl)-2,1,3-benzothiadiazole)-2',2"-diyl](F8TBT) may also be used, alone or with a fullerene derivative.

As discussed above, a difference of voltage between anode layer 118 and cathode layer 120 may drive any charge generated in the photoactive layer 122 towards the electrodes, which allows measurement of photons interacting with the light detecting panel. In active region 142 of photodiode 117, the collected charge may be transported to the corresponding pixel of the backplane detector 116. The active region 132 may be defined by boundaries 138 of the anode layer 118 and by the distance between a region of the photoactive layer 122 and the photodiode 117 and the contact region 119.

The region 119 in which the anode layer 118 may form a contact with backplane detector 116 may be uneven. In the illustrated example, the coupling in region 119 takes place in a recessed region of the photodiode 117. As mentioned above, the photoactive layer 122 may be formed by placing a wet coating layer having the photoactive materials (e.g., an OPD coating). While the OPD coating may conform to the underlying surface and may fill the recessed regions, the thickness of the layer may be non-uniform. The flows of the liquid due to surface tensions effects, viscosity change, and evaporation of the solvent during the drying process may lead to variations in thickness, particularly around convex edges, such as corners 126, and concave edges, such as corners 124. As a result, corners 124 may have a thinner layer than corners 126 due to the reflow that takes place during the evaporation of the solvent of the wet OPD coating. Variations in the thickness of photodiode 117 along the backplane may lead to uneven electric fields through the photoactive layer 117, which may result in excess current leakage in some regions of the pixel circuitry. These leakages and/or accumulation of electric fields may ultimately affect the quality of the resulting image and the reliability of the display panel.

FIG. 3 also illustrates active regions 132, inactive regions 140, and fringe regions 142. Active regions 132 may be regions delimited by the anode layer 118 as discussed above. Regions outside the active regions 132 may be part of the inactive regions 140. Inactive regions 140 of the photoactive layer 122 may, generally, under an electric field produced by a cathode and/or anode. As a result, charges generated in an inactive region 140 of the photoactive layer 122 may remain in the layer instead of being sensed by the backplane detector 116, and therefore may not affect data used to generate images. Note, however, that due to the geometrical disposition of anode layer 118 and cathode layer 120, a weakly polarized region 144 in the photoactive layer 122 may create a fringe region 142. In fringe regions 142, charges generated in regions 144 of the OPD layer 122, may be collected by the anode layer 118 and cathode layer 120. However, such collection may occur with substantial delay, due to the increased distance from the anode layer 118. As a result, the presence of these fringe regions may affect speed characteristics of the sensor panel, such as refresh rate and/or sampling rate. As the pixel size shrinks, the effect of the fringe OPD may become stronger. For example, in a panel having pixel pitch of 100 μm and a fringe region with width 1 μm, the ratio between the fringe area and total area may be as high as 4%.

Figure 4:
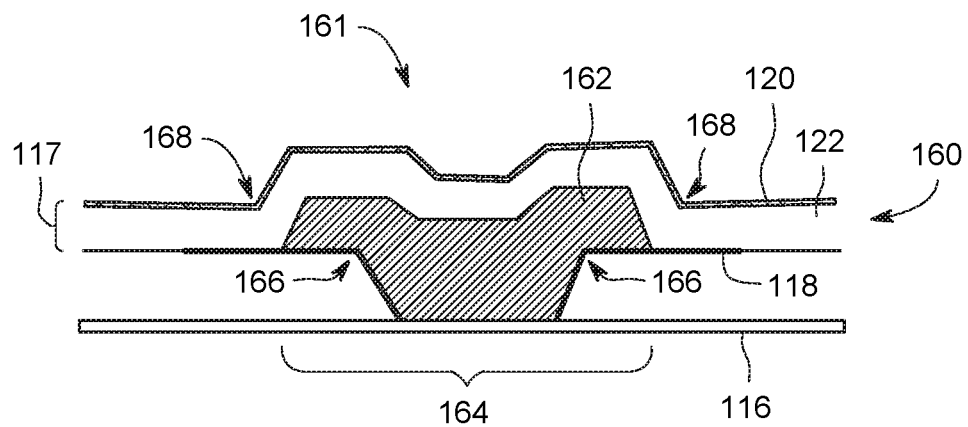
FIG. 4 is a schematic diagram of a pixel of an image detector having a buried via, in accordance with an embodiment.

The front view illustrated in the diagram 160 of FIG. 4 illustrates an alternative embodiment 161 for a pixel, in which coupling between photodiode and backplane detector 116 takes place through a buried via 164. The buried via may be formed by a dielectric element 162 disposed in the region of contact between anode 118 and the backplane detector 116. The presence of the dielectric element 162 may cause the photoactive layer 122 to be more planar, reducing the inhomogeneity in the thickness of the photoactive layer 122. Furthermore, the presence of the dielectric element 162 may make region of the photoactive layer 122 above the buried via 164 inactive since, in this region, photoactive layer 122 is electrically isolated from the anode 118 and, thus, charges generated by a photon interacting with photoactive layer 122 may not be sensed. As discussed above, the regions where the anode 118 contacts with the backplane detector 116 (e.g., region 119 in FIG. 3) are more likely to have non-homogeneities, due to the presence of backplane coupling (e.g., termination) structures. Since this region may become inactive due to the presence of dielectric 162, the photodiode 117 becomes less susceptible to electric field build-ups and/or current leakages. Accordingly, the use of buried via 164 may improve the quality of images produced by the system. It should be noted that the placement of the dielectric element 162 generates an inactive region in the pixel, which may reduce the pixel fill factor (i.e., the ratio between the active area of the pixel and the total area of the pixel). In some embodiments, the buried via may reduce the pixel fill factor by 1%.

Figure 5:
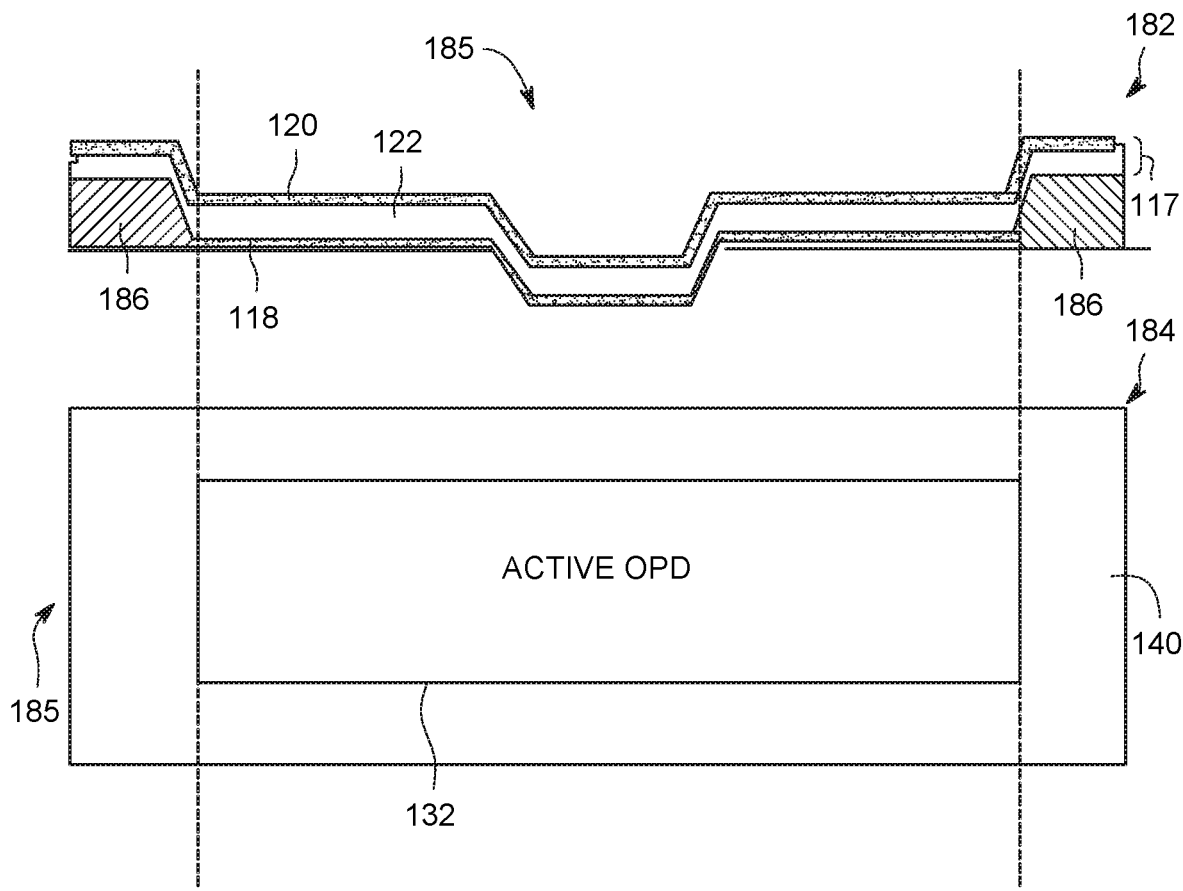
FIG. 5 is a schematic front and side view of a pixel of an image detector with a dielectric layer around the edge of the pixel, in accordance with an embodiment.

The front view 182 and top view 184 in FIG. 5 illustrate an alternative embodiment of a pixel 185 that reduces fringe regions. As discussed above with respect to FIG. 3, fringe regions are regions of the photoactive layer 122 that may be weakly charged and may lead to increased lag during data acquisition. In pixel 185, the inactive regions 140 in the boundaries between two neighboring pixels may have dielectric structures 186 that separates the photoactive layer 122 from the anode layer 118 in the inactive regions. The presence of these dielectric structures 186 prevents charges generated due to interaction between photons and the photoactive layer 122 in the inactive region 140, reducing and/or removing the fringe region of the pixel (such as region 142 illustrated in FIG. 3). The reduction or removal of the fringe region may lead to reduction of the lag between images, as discussed above.

Note that both the dielectric structures 162 illustrated in FIG. 4 as well as dielectric structures 186 illustrated in FIG. 5 may be employed separately or combined. Note further that, as detailed below, these structures may be generated in a common photolithographic process and, as such, a single photolithographic step may be incorporated to the production of the light detecting panel to facilitate the inclusion of the two dielectric structures.

Figure 6:
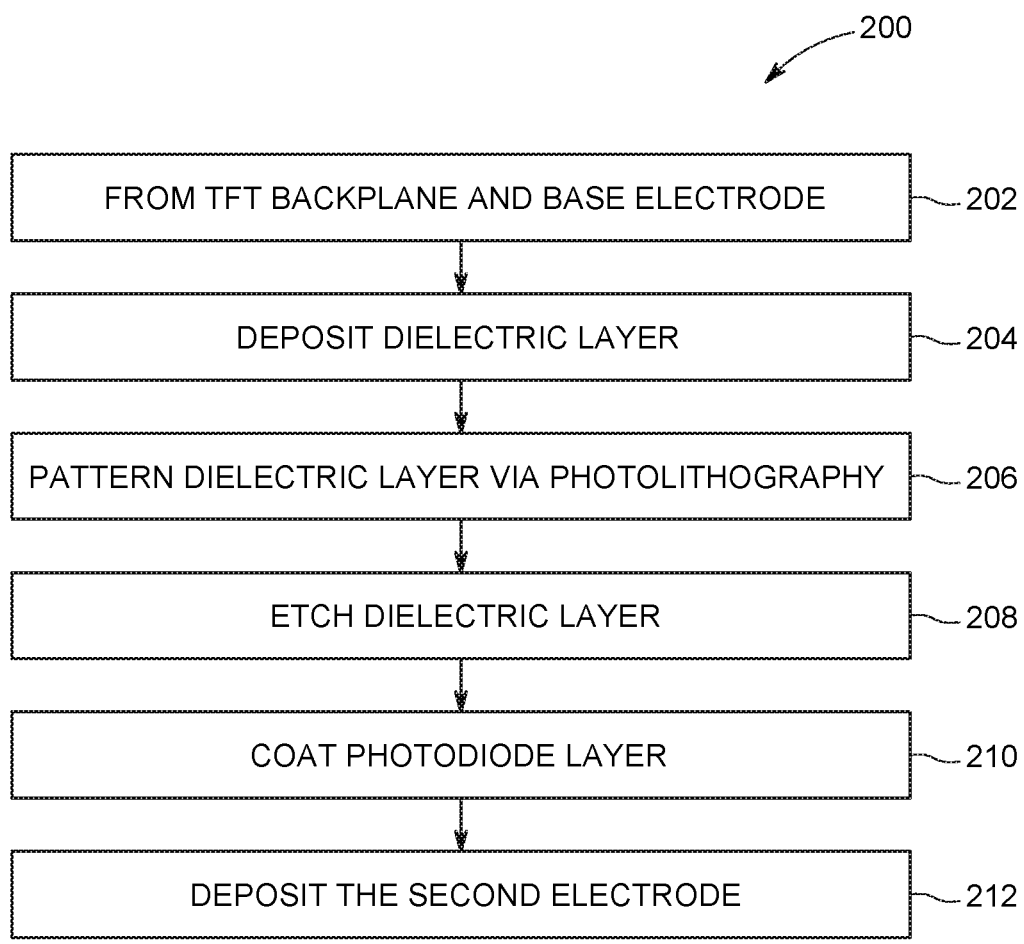
FIG. 6 is a flow chart of a method for production of an image detector that may be used to produce image detectors having pixel structures such as the ones of FIGS. 3, 4, and 5.

Method 200 in FIG. 6 may be employed to produce the above-described light detecting panel embodiments using a photodiode layer. In a process 202, a pixelated backplane of a sensor panel may be fabricated. The pixelated backplane may have an array of circuitry elements responsible for recording signals received by a region of the sensor panel. To that end, terminations (i.e., electrical pads, electrical contacts) of a sensing and/or amplifying element, such as a transistor, may be exposed. As an example, the pixelated backplane array may be formed employing thin film transistor (TFT) technology, and the gate termination of the TFT elements may be employed as a driver for the pixel. Process 202 may also include steps to form a base electrode, which may be an anode. The base electrode may couple to the terminations of the pixelated backplane array at the contact points, as described above. The base electrode layer may include conductive materials such as indium tin oxide (ITO), indium zinc oxide (IZO).

In a process 204, a dielectric, such as silicon oxide, silicon nitride, aluminum oxide, zirconium oxide, tantalum oxide, other metal oxides, or any other material may be deposited above the base electrode layer to produce any of the dielectric structures described above using photolithography. The thickness of the dielectric layer can be 0.5 um to 5 um. In a process 206, a photolithography mask may be placed above the dielectric layer that is coated with photoresist, and ultraviolet light or some other mechanism may be used to expose photoresist coated on dielectric layer. The photolithography mask may pattern the structures to form the buried via structure and/or the boundary structures in the pixel array, as discussed above. Following the photolithography development, the excess photoresist may be removed using a solvent. Note that the photolithography process may be a positive photolithography, in which the exposed regions may become soluble, or a negative photolithography, in which the non-exposed regions may become soluble. The cured dielectric structures formed during the photolithography may cover the region above the contact interface between the base electrode layer and the backplane array termination, to form the buried via described above. The cured dielectric structures may also be located in the inactive regions between the pixels of the sensing panel, to mitigate the fringe regions, as described above.

In a process 208, the dielectric structures may be etched. The dielectric structures may be etched to form buried contact vias. The dielectric structures along the boundaries of each pixel may be etched, allowing sufficient height to prevent the formation of fringe regions in the photodiode. Following etching in process 208, the photoactive layer may be placed above the patterned dielectric layer in a process 210. The photoactive layer may be composed by a wet mixture of the organic photodiode material and a solvent. Process 210 may also include steps for drying the solvent to produce a dry layer. Following the placement of the photoactive layer, the second electrode layer of the photodiode may be placed above the photoactive layer in a process 212.

Technical effects of the invention include the production of a sensor panel that may include organic photodiodes with reduced pixel leakage, long term reliability, and low image lag. To that end, the sensor panels discussed herein may be formed from a continuous OPD layer placed above a pixelated backplane that is coupled to an anode of the OPD layer through a recess in the OPD. In some embodiments, dielectric structures may be placed in the region of the coupling between the OPD anode and the backplane to form a buried via that reduces thickness inhomogeneity in the photoactive layer of the OPD in the active areas of the pixel. In some embodiments, dielectric structures may be placed in the boundary regions between neighboring pixels, to mitigate the creation of fringe OPD regions.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. An imaging system comprising:
a radiation source;
a detector panel configured to receive an emission produced by the radiation source and transmitted through a subject disposed between the radiation source and the detector panel, wherein the detector panel comprises:
  a thin film transistor (TFT) backplane on a substrate; and
  a photodiode layer comprising:
    an anode layer comprising a plurality of anodes, wherein each anode couples electrically to a corresponding pixel of the TFT backplane through a pixel coupling, and wherein the anode layer comprises a plurality of boundaries between the anodes that separates adjacent pixels;
    an organic photoactive layer comprising an organic photodiode material and disposed above the anode layer;
    a plurality of dielectric structures disposed above the anode layer and below the organic photoactive layer, wherein the plurality of dielectric structures comprise dielectric structures disposed along the boundaries that separate the pixels, wherein an entirety of the dielectric structures are disposed along the boundaries without covering any portion of the plurality of anodes; and
    a cathode layer disposed above the organic photoactive layer and the plurality of dielectric structures, wherein the anode layer is disposed closer to the TFT backplane than the cathode layer; and
a scintillator layer disposed above the detector panel.

2. The imaging system of claim 1, wherein the plurality of dielectric structures comprise dielectric structures disposed above the corresponding pixel coupling, and below the organic photoactive layer.

3. The imaging system of claim 2, wherein at least one dielectric structure of the plurality of dielectric structures and the corresponding pixel coupling forms a buried via.

4. The imaging system of claim 1, wherein the imaging system is a tomosynthesis system or a mammography system.

5. The imaging system of claim 1, wherein the system comprises:
a data acquisition system coupled to the detector panel and configured to collect imaging data; and
an image processing device configured to produce an image from the collected image data.

6. The imaging system of claim 1, wherein the plurality of dielectric structures comprise silicon oxide, silicon nitride, or any combination thereof.

7. The imaging system of claim 1, wherein the plurality of dielectric structures comprise metal oxides which comprise aluminum oxide, zirconium oxides, tantalum oxide, or any combination thereof.

8. The imaging system of claim 1, wherein each of the dielectric structures of the plurality of dielectric structures comprises a thickness between 0.5 um to 5 um.

9. An organic photodiode panel comprising:
a cathode layer;
an anode layer comprising at least one pixel;
a photoactive layer disposed between the cathode layer and the anode layer comprising an organic photodiode material;
at least one dielectric structure disposed between the photoactive layer and the anode layer; and
a thin film transistor (TFT) backplane disposed on a substrate and electrically coupled to the anode layer, wherein the anode layer is disposed closer to the TFT backplane than the cathode layer, and wherein the anode layer comprises a recess in a region of contact between the anode layer and the TFT backplane, and wherein the at least one dielectric structure is disposed directly above the recess to form a buried via that directly contacts the TFT backplane while the at least one dielectric structure is covered by both the photoactive layer and the cathode layer.

10. The organic photodiode panel of claim 9, wherein the at least one dielectric structure comprises a dielectric structure disposed along a boundary of the at least one pixel without covering the anode layer.

11. The organic photodiode panel of claim 9, wherein the at least one dielectric structure comprises silicon oxide, silicon nitride, or both.

12. The organic photodiode panel of claim 9, wherein the at least one dielectric structure comprises a metal oxide that comprises aluminum oxide, zirconium oxide, tantalum oxide, or any combination thereof.

13. The organic photodiode panel of claim 9, wherein the thickness of the at least one dielectric structure is between 0.5 μm and 5μm.

14. The organic photodiode panel of claim 9, wherein a pitch comprising a separation between the at least one pixel and the nearest neighboring pixel is between 50 μm and 200 μm.

15. A detector panel comprising a plurality of pixels, comprising:
a cathode layer comprising a first cathode is associated with a first pixel of the plurality of pixels and a second cathode is associated with a second pixel of the plurality of pixels;
a continuous organic photoactive layer comprising an organic photodiode material and disposed below the cathode layer;
an anode layer disposed below the organic photoactive layer, the anode layer comprising a first anode associated with the first pixel and a second anode associated with the second pixel; and
a thin film transistor (TFT) backplane comprising a first pixel circuitry electrically coupled to the first anode and a second pixel circuitry coupled to the second anode, and wherein the anode layer is disposed closer to the TFT backplane than the cathode layer;
wherein the first pixel is adjacent to the second pixel, and wherein the detector panel comprises a dielectric structure disposed along a boundary between the first pixel and the second pixel, and the dielectric structure does not cover any portion of the first anode and the second anode.

16. The detector panel of claim 15, comprising a dielectric structure disposed between the organic photoactive layer and a contact region between the first anode and the first pixel circuitry.

17. The detector panel of claim 15, wherein the organic photodiode material comprises at least one low bandgap polymer.

* * * * *